United States Patent [19]

Allen et al.

[11] Patent Number: 4,814,635

[45] Date of Patent: Mar. 21, 1989

[54] VOLTAGE TRANSLATOR CIRCUIT

[75] Inventors: Gordon H. Allen, Gilbert; Byron G. Bynum, Mesa; David B. Harnishfeger, Chandler, all of Ariz.

[73] Assignee: Motorola, Inc., Schaumburg, Ill.

[21] Appl. No.: 126,135

[22] Filed: Nov. 27, 1987

[51] Int. Cl.[4] ............................................. H03K 5/24
[52] U.S. Cl. ...................................... 307/264; 307/362
[58] Field of Search .................... 307/296 R, 297, 362, 307/303, 264

[56] References Cited

U.S. PATENT DOCUMENTS

| | | | |
|---|---|---|---|
| 3,975,649 | 8/1976 | Kawagoe et al. | 307/297 |
| 4,323,846 | 4/1982 | Haraszti | 307/297 |
| 4,603,267 | 7/1986 | Kowallek | 307/296 R |
| 4,697,110 | 9/1987 | Masuda et al. | 307/297 |

Primary Examiner—John Zazworsky
Attorney, Agent, or Firm—Michael D. Bingham

[57] ABSTRACT

A voltage translator circuit generates a predetermined output voltage (e.g. one half of the supply voltage) in response to a predetermined input voltage. A pair of matched field effect transistors are coupled in series between first and second sources of supply voltage. The gate of the load transistor is coupled to a reference voltage, and the gate of the drive transistor is coupled to a source of input voltage. When both transistors are subject to the same operating conditions (at a predetermined input voltage level), their effective resistances become equal and the supply voltage is divided in half. The circuit does not depend for its operation upon precise threshold voltages of the devices as long as the devices are matched.

13 Claims, 1 Drawing Sheet

VOLTAGE TRANSLATOR CIRCUIT

BACKGROUND OF THE INVENTION

This invention relates generally to voltage translator circuits and, more particularly, to a voltage translator circuit the output of which is independent of transistor threshold.

A known voltage translator circuit switches from an "off" state to an "on" state when the gate of an input N-channel junction field effect transistor (JFET) is driven sufficiently negative to reach its pinch-off threshold. An output transistor (Q1) has its base-emitter junction coupled across the source and drain of the JFET. When the JFET reaches its pinch-off threshold, a voltage will develop across the source-drain of the JFET large enough to turn on the base-emitter junction of Q1 thus enabling Q1 to sink large currents. Base drive is provided by a resistor coupled between the base terminal of Q1 and a source of supply voltage ($V_{CC}$). Thus, the threshold (pinch-off voltage) of the JFET significantly affects the circuit threshold voltage.

SUMMARY OF THE INVENTION

It is an object of the present invention to provide an improved voltage translator circuit.

It is a further object of the present invention to provide a voltage translator circuit having an output which is independent of transistor threshold.

It is a still further object of the present invention to provide a voltage translator circuit which generates a desired output voltage at a predetermined input voltage.

It is a further object of the present invention that the predetermined input voltage be below the circuit ground.

Yet another object of the present invention is to provide an improved voltage translator circuit having an output which is independent of changes in the supply voltage.

According to a broad aspect of the invention there is provided a voltage translator circuit for generating at an output node a predetermined output voltage in response to a predetermined input voltage, comprising a first field effect transistor having a source electrode for coupling to a first source of supply voltage, a drain electrode coupled to said node, and a gate electrode for coupling to a first reference voltage; and a second field effect transistor having a source electrode for coupling to the drain electrode of said first field effect transistor, a drain electrode for coupling to a second source of supply voltage, and a gate electrode for coupling to a source of input voltage.

The above and other objects, features and advantages of the present invention will be more clearly understood from the following detailed description taken in conjunction with the accompanying drawings, in which:

DESCRIPTION OF THE PREFERRED EMBODIMENT

Figure 1:
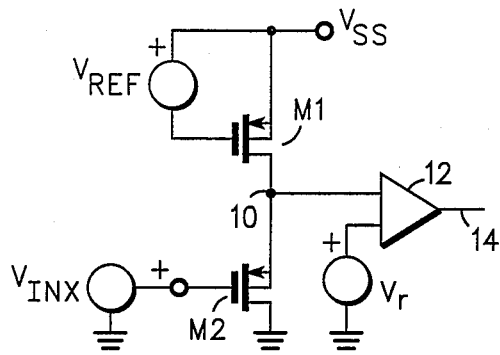
FIG. 1 is a schematic diagram of the inventive voltage translator circuit.

The inventive circuit shown in FIG. 1 includes first and second matched P-channel field effect transistors M1 and M2 respectively. The source electrode of transistor M1 is coupled to a source of supply voltage VSS. The drain electrode of transistor M1 is coupled to the source electrode of transistor M2, and the drain electrode of transistor M2 is coupled to a second source of supply voltage, in this case ground. The junction of the drain of transistor M1 and the source of transistor M2 forms the voltage translator circuit output (node 10). A source of a reference voltage (VREF) is coupled between the gate of transistor M1 and VSS. A source of an input signal VIN is coupled between the gate of transistor M2 and ground. To provide for additional gain, the voltage at node 10 is compared with a reference voltage ($V_R = VSS/2$) in comparator 12 which is provided with an output 14.

The purpose of the circuit shown in FIG. 1 is to provide an accurate predictable voltage at node 10 when a predetermined input voltage, $VIN_X$, is applied to the gate of transistor M2. If the desired voltage at node 10 is chosen to be VSS/2, the gate to source voltage on transistor M2 would equal $VIN_X - (VSS/2)$. Thus, the same voltage $VIN_X - (VSS/2)$ must be applied from the gate to source of transistor M1. Thus, $V_{REF} = VIN_X - (VSS/2)$.

Stated differently, the voltage trip point (the point at which the comparator 12 switches states), will occur when transistor M2 sinks an amount of current equal to that being sourced by transistor M1. Ideal matching between transistors M1 and M2 occurs not only when the source to gate voltage of each of the transistors is substantially equal but also when the source to drain voltage of each of the transistors is equal. Both of these conditions are satisfied when the trip point is chosen to be VSS/2. Using state of art layout and manufacturing techniques, M1 and M2 can be matched very accurately. Thus, it should be clear that for proper operation of the circuit, it is only necessary that the threshold voltage of transistors M1 and M2 be substantially equal. The absolute value of this threshold voltage has little significance and therefore the above stated objective of a transistor threshold independent voltage translator circuit has been achieved.

Figure 2:
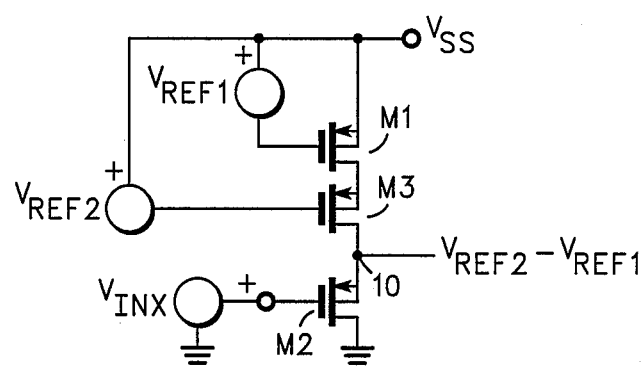
FIG. 2 is a schematic diagram of a modified version of the inventive voltage translator circuit shown in FIG. 1.

As was stated previously, it is an objective to provide a voltage translator circuit which is suitable for applications which require the voltage translations to be substantially independent of changes in VSS. This would allow the comparator reference voltage, Vr, to be independent of VSS and thus not be forced to change as VSS changes to maintain the desired circuit threshold voltage. Such a circuit is shown in FIG. 2 wherein a third matched P-channel field effect transistor M3 has been inserted between transistors M1 and M2. That is, transistor M3 has a source coupled to the drain of transistor M1 and has a drain coupled to node 10 (the source of transistor M2). A second source of a reference voltage VREF2 is coupled between the gate of transistor M3 and the supply voltage VSS. Again, transistors M1, M2 and M3 are matched PMOS transistors. The gate-to-source voltage of transistor M1 is VREF1, and the voltage at the gate of transistor M3 is set at VSS−VREF2. Since the current in transistors M1 and M3 is identical, the gate to source voltage of transistor M3 is approximately equal to the gate to source voltage of transistor M1. The value of the source to drain voltage at transistor M1 is therefore approximately equal to VREF2−VREF1.

Since transistors M1 and M3 are connected in a cascode configuration, the drain current of transistor M3 is not sensitive to changes in the supply voltage VSS. When the input voltage VIN falls to a level low enough to cause the gate to source voltage of transistor M2 to be equal to the gate to source voltage at transistor M1, the source to drain voltage of transistor M2 is approximately equal to the source to drain voltage of transistor M1, and the current which is flowing in transistor M2 is identical to the current flowing in transistors M1 and M3. If $VIN_X$ is defined as that voltage which enables transistor M2 to conduct exactly the amount of current available from transistor M1, then $VIN_X$ is approximately equal to $VREF_2 - 2VREF_1$. The voltage at the source of transistor M2 (node 10) when $VIN_X$ is applied to the gate of transistor M2 is approximately equal to VREF2−VREF1.

Thus, there has been provided a circuit which is significantly less dependent on the threshold voltage of the individual transistors. This results in tighter circuit threshold tolerances and improved manufacturability. In addition, the input voltage which results in the generation of the desired output voltage may be negative with respect to ground.

Figure 3:
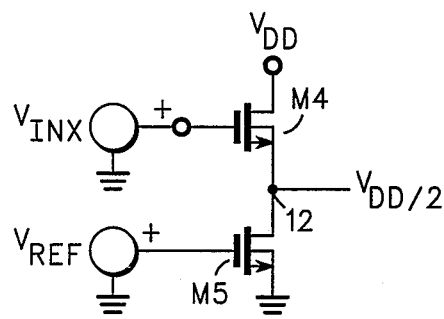
FIG. 3 is a schematic diagram illustrating the N-channel equivalent of the circuit of FIG. 1.
Figure 4:
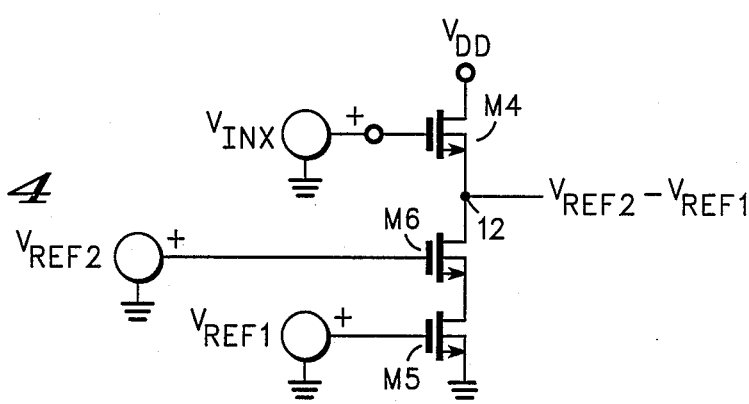
FIG. 4 is schematic diagram of a modified version of the inventive voltage translator circuit shown in FIG. 3.

While the inventive circuit has been shown as comprising P-channel field effect transistors, it should be clear that the circuits may be constructed with N-channel field effect transistors. The N-channel equivalents of the circuits shown in FIGS. 1 and 2 are shown in FIGS. 3 and 4 respectively. For example, referring to FIG. 3, first and second matched N-channel field effect transistors M4 and M5 are coupled in series between ground and a source of supply voltage $V_{DD}$. A reference voltage VREF is coupled between ground and the gate of transistor M5, and a source of an input voltage $VIN_X$ is coupled between ground and the gate of transistor M4. The output of the circuit occurs at node 12. When the operating conditions across transistors M4 and M5 are substantially identical, a voltage VDD/2 will appear at node 12. This will occur at a predetermined $VIN_X$.

To render this circuit independent of changes in VDD, N-channel field effect transistor M6 is inserted between transistors M4 and M5 as is shown in FIG. 4. A second reference voltage VREF2 is coupled between ground and the gate of transistor M6.

In operation, the NMOS circuits shown in FIGS. 3 and 4 operate in a substantially similar fashion as those shown in FIGS. 1 and 2 respectively with the polarities reversed.

It should also be clear that while the trip points of FIGS. 1 and 3 were chosen to be VSS/2 and −VSS/2 respectively, the trip points could have been made to occur at any desired fraction of VSS by simply properly ratioing transistors M1 to M2 and M4 to M5 respectively.

The above description is given by way of example only. Changes in form and details may be made by those skilled in the art without departing from the scope of the invention as defined by the appended claims.

We claim:

1. A voltage translator circuit for generating a predetermined output voltage at an output node in response to a predetermined input voltage, comprising:
   a first field effect transistor having a source electrode for coupling to a first source of supply voltage, a drain electrode coupled to said node, and a gate electrode for coupling to a first reference voltage;
   a second field effect transistor having a source electrode for coupling to the drain electrode of said first effect transistor, a drain electrode for coupling to a second source of supply voltage, and a gate electrode for coupling to a source of input voltage; and
   means for comparing the output voltage at the output node to a third reference voltage such that the output voltage is equal to said third reference voltage whenever the operating conditions of said first and second field effect transistors are substantially equal responsive to the predetermined input voltage being supplied to said gate of said second field effect transistor.

2. A circuit according to claim 1 wherein said first and second field effect transistors are matched P-channel field effect transistors.

3. A circuit according to claim 2 wherein said predetermined output voltage is substantially equal to one half of the value of the difference voltage between said first and second sources of supply voltage.

4. A circuit according to claim 3 wherein said second source of supply voltage is ground.

5. A circuit according to claim 4 wherein said predetermined input voltage is negative with respect to ground.

6. A circuit according to claim 1 wherein said first and second field effect transistor are matched N-channel field effect transistors.

7. A circuit according to claim 6 wherein said predetermined output voltage is substantially equal to one half of the value of the difference voltage between said first and second sources of supply voltage.

8. A circuit according to claim 7 wherein said first source of supply voltage is ground.

9. A voltage translator circuit for generating a predetermined output voltage at an output node in response to a predetermined input voltage, comprising:
   a first field effect transistor having a source electrode for coupling to a first source of supply voltage, a drain electrode coupled to said node, and a gate electrode for coupling to a first reference voltage;
   a second field effect transistor having a source electrode for coupling to the drain electrode of said first field effect transistor, a drain electrode for coupling to a second source of supply voltage, and a gate electrode for coupling to a source of input voltage; and
   a third field effect transistor having its source drain path coupled in series between said first and second field effect transistors and having a gate electrode for coupling to a second source of reference voltage.

10. A circuit according to claim 9 wherein said first, second and third field effect transistors are matched P-channel field effect transistors.

11. A circuit according to claim 10 wherein said predetermined output voltage is substantially equal to one half of the value of the difference voltage between said first and second sources of supply voltage.

12. A circuit according to claim 9 wherein said first, second and third field effect transistors are matched N-channel field effect transistors.

13. A circuit according to claim 12 wherein said predetermined output voltage is substantially equal to one half of the value of the difference voltage between said first and second sources of supply voltage.

* * * * *